(12) United States Patent
Guillot et al.

(10) Patent No.: US 11,140,793 B2
(45) Date of Patent: Oct. 5, 2021

(54) ELECTRONIC MODULE WITH IMPROVED MOISTURE PROTECTION

(71) Applicants: SAFRAN ELECTRONICS & DEFENSE, Boulogne Billancourt (FR); SAFRAN ELECTRICAL & POWER, Blagnac (FR)

(72) Inventors: François Guillot, Boulogne Billancourt (FR); Jean-Marc Blineau, Boulogne-Billancourt (FR); Philippe Avignon, Boulogne-Billancourt (FR); Serge Roques, Boulogne-Billancourt (FR); Franck Albero, Boulogne-Billancourt (FR)

(73) Assignees: SAFRAN ELECTRONICS & DEFENSE, Boulogne-Billancourt (FR); SAFRAN ELECTRICAL & POWER, Blagnac (FR)

( * ) Notice: Subject to any disclaimer, the term of this patent is extended or adjusted under 35 U.S.C. 154(b) by 0 days.

(21) Appl. No.: 16/604,887

(22) PCT Filed: Apr. 10, 2018

(86) PCT No.: PCT/EP2018/059146
§ 371 (c)(1),
(2) Date: Oct. 11, 2019

(87) PCT Pub. No.: WO2018/189169
PCT Pub. Date: Oct. 18, 2018

(65) Prior Publication Data
US 2020/0107459 A1    Apr. 2, 2020

(30) Foreign Application Priority Data

Apr. 12, 2017 (FR) ..................... 17 53230

(51) Int. Cl.
*H05K 5/02* (2006.01)
*G05B 15/02* (2006.01)
(Continued)

(52) U.S. Cl.
CPC .......... *H05K 5/0213* (2013.01); *G05B 15/02* (2013.01); *H05K 1/18* (2013.01); *H05K 5/0026* (2013.01); *H05K 2201/10151* (2013.01)

(58) Field of Classification Search
CPC .................................................... G01N 25/68
See application file for complete search history.

(56) References Cited

U.S. PATENT DOCUMENTS

2005/0073815 A1* 4/2005 Hirano ................ H04N 5/335
  361/704
2005/0264138 A1* 12/2005 Ohmori ................ B41J 2/1632
  310/328

(Continued)

FOREIGN PATENT DOCUMENTS

DE        198 13 924 A1    9/1999
DE   20 2014 000 544 U1    2/2014
(Continued)

OTHER PUBLICATIONS

"Peltier Element, 2021, CDN, https://www.cdn-inc.com/creativity-unfiltered-peltier-element/#:~:text=A%20Peltier%20Element%20is%20a,it'll%20actually%20produce%20electricity!" (Year: 2021).*
(Continued)

*Primary Examiner* — Santosh R Poudel
(74) *Attorney, Agent, or Firm* — Muncy, Geissler, Olds & Lowe, P.C.

(57) ABSTRACT

Electronic module comprising a protective casing defining an internal volume and an electronic board placed in the internal volume, the electronic module comprising: means,
(Continued)

for detecting a predetermined environmental condition of the internal volume, means for generating a cool zone inside the internal volume, which means are arranged such that the cool zone is separated from the electronic board; a control unit that is linked to the means for detecting an environmental condition and to the means for generating a cool zone and arranged to trigger the means for generating a cool zone when the means for detecting a predetermined environmental condition in the internal volume detect an environmental condition that is liable to result in the moisture in the air contained in the internal volume condensing on the electronic board.

7 Claims, 3 Drawing Sheets

(51) Int. Cl.
  *H05K 1/18*   (2006.01)
  *H05K 5/00*   (2006.01)

(56) References Cited

U.S. PATENT DOCUMENTS

| | | | |
|---|---|---|---|
| 2011/0072834 A1 | 3/2011 | Ishikura et al. | |
| 2013/0055744 A1* | 3/2013 | Travers | F25D 16/00 62/186 |
| 2013/0252043 A1* | 9/2013 | Allison | H01M 10/42 429/72 |
| 2015/0124390 A1* | 5/2015 | Koch | G06F 1/1633 361/679.26 |
| 2016/0233563 A1* | 8/2016 | Oshima | H01M 10/613 |
| 2016/0352062 A1* | 12/2016 | Takigawa | H01S 5/02453 |
| 2018/0268863 A1* | 9/2018 | Gale | G11B 23/287 |

FOREIGN PATENT DOCUMENTS

| | | |
|---|---|---|
| FR | 3 040 582 A1 | 3/2017 |
| WO | WO 03/069749 A1 | 8/2003 |

OTHER PUBLICATIONS

"Denise Nyland, Why Does a Bathroom Mirror Turn Misty After a Shower?, https://www.hunker.com/13412589/why-does-a-bathroom-mirror-turn-misty-after-a-shower" (Year: 2021).*

* cited by examiner

ELECTRONIC MODULE WITH IMPROVED MOISTURE PROTECTION

FIELD OF THE INVENTION

The present invention concerns the field of electronics and more particularly modules including an electronic circuit board.

BACKGROUND OF THE INVENTION

There are known electronic modules comprising a data processing electronic circuit board, means for connecting a data line to enable exchange of data and of instructions with the electronic circuit board, and means for connecting a power line for supplying the electronic circuit board with energy.

There exist electronic modules of the above kind that are adapted to be plugged parallel to one another into an avionics rack provided with connectors intended to cooperate with the data and power connection means of the electronic modules. The avionics rack employs forced ventilation to cool the electronic modules contained in the avionics rack.

The electronic components and more generally the electrical conductors present on the electronic circuit boards must be protected from dust, from moisture and from chemical or mechanical attack of any kind. Moisture in liquid form is in particular responsible for malfunctions of the electronic circuit board resulting from the creation of short circuits or oxidation of the electronic components or the conductors of the electronic circuit board.

It is still the case that the temperature variations that may be encountered in an aircraft and the relative humidity of the air present in the latter generate condensation phenomena causing the deposition of moisture in liquid form on the electronic circuit board.

Using air drying systems in the avionics racks has been envisaged. These systems are complex, costly and bulky and increase the mass of the module.

Applying a protective varnish to the whole of the electronic circuit board has been envisaged as an alternative. Parylene is an element frequently used for this purpose. However, protection by means of a varnish in this way considerably increases the weight of the circuit board, with up to 200% additional weight, which is a penalty in an aeronautical application. Moreover, the presence of varnish makes it virtually impossible to repair the electronic circuit board, which increases equipment maintenance costs.

OBJECT OF THE INVENTION

An aim of the invention is to improve the protection of electronic modules against moisture.

SUMMARY OF THE INVENTION

To this end, there is provided in accordance with the invention an electronic module comprising a protective casing defining an internal volume and an electronic circuit board placed in the internal volume. The electronic module includes means for detecting a predetermined environmental condition of the internal volume and means for generating a cold zone inside the internal volume such that the cold zone is separated from the electronic circuit board. A control unit is connected to the means for detecting an environmental condition and to the means for generating a cold zone.

According to the invention, the control unit is adapted to trigger the means for generating a cold zone when the means for detecting a predetermined environmental condition in the internal volume detect an environmental condition that is liable to result in the moisture in the air contained in the internal volume condensing on the electronic circuit board.

If the control unit detects environmental conditions liable to cause condensation of the moisture in the air contained in the internal volume the control unit is able to command the means for generating a cold zone. The moisture is therefore forced to condense in the cold zone rather than on the electronic circuit board. The cold zone being separate from the electronic circuit board, condensation does not occur on the electronic circuit board. The protective casing protects the electronic circuit board from dust, external moisture, smoke and chemical or mechanical attacks of any sort, rendering protection of the electronic circuit board by varnish of no utility.

In the context of the present application, a cold zone is a localized volume or surface the temperature of which is lower than that of a reference zone. A cold zone may be produced by raising the temperature of the reference zone, which creates a temperature gradient and therefore the appearance of a zone of higher temperature and zone of lower temperature. A cold zone may also be produced by reducing the temperature of said cold zone.

The protective envelope is preferably demountable. The electronic circuit board can then be repaired simply by extracting it from the protective casing.

A particularly economical embodiment is obtained when the means for detecting a predetermined environmental condition comprise a first temperature sensor fastened to the electronic circuit board and/or a second temperature sensor fastened to the protective casing. Rapid and simple detection of the appearance of an environmental condition liable to cause condensation of the moisture from the air contained in the internal volume on the electronic circuit board is obtained when the control unit is adapted to trigger the means for generating a cold zone when a temperature measured by the first temperature sensor is lower than the temperature measured by the second temperature sensor.

Unnecessary triggering of the means for generating a cold zone is avoided if the control unit is adapted to trigger the means for generating a cold zone only if the temperature measured by the first temperature sensor is lower than a predetermined threshold temperature. This also avoids impacting the mean time between failures of the electronic circuit board.

The module of the invention is particularly robust when the means for generating a cold zone comprise a Peltier effect cell that has a hot face and a cold face. The hot face of the Peltier effect cell is preferably thermally connected to the protective casing or to a thermally conductive chassis of the electronic module.

The means for generating a cold zone are advantageously such that the condensates resulting from the condensation of the air contained in the internal volume are directed to a dedicated retention zone of the internal volume and/or to the exterior of the internal volume. The retention zone is advantageously coated with a protective resin.

Other features and advantages of the invention will emerge from the following description of one particular nonlimiting embodiment of the invention.

BRIEF DESCRIPTION OF THE DRAWINGS

Reference will be made to the appended figures in which.

DETAILED DESCRIPTION OF THE INVENTION

Figure 1:
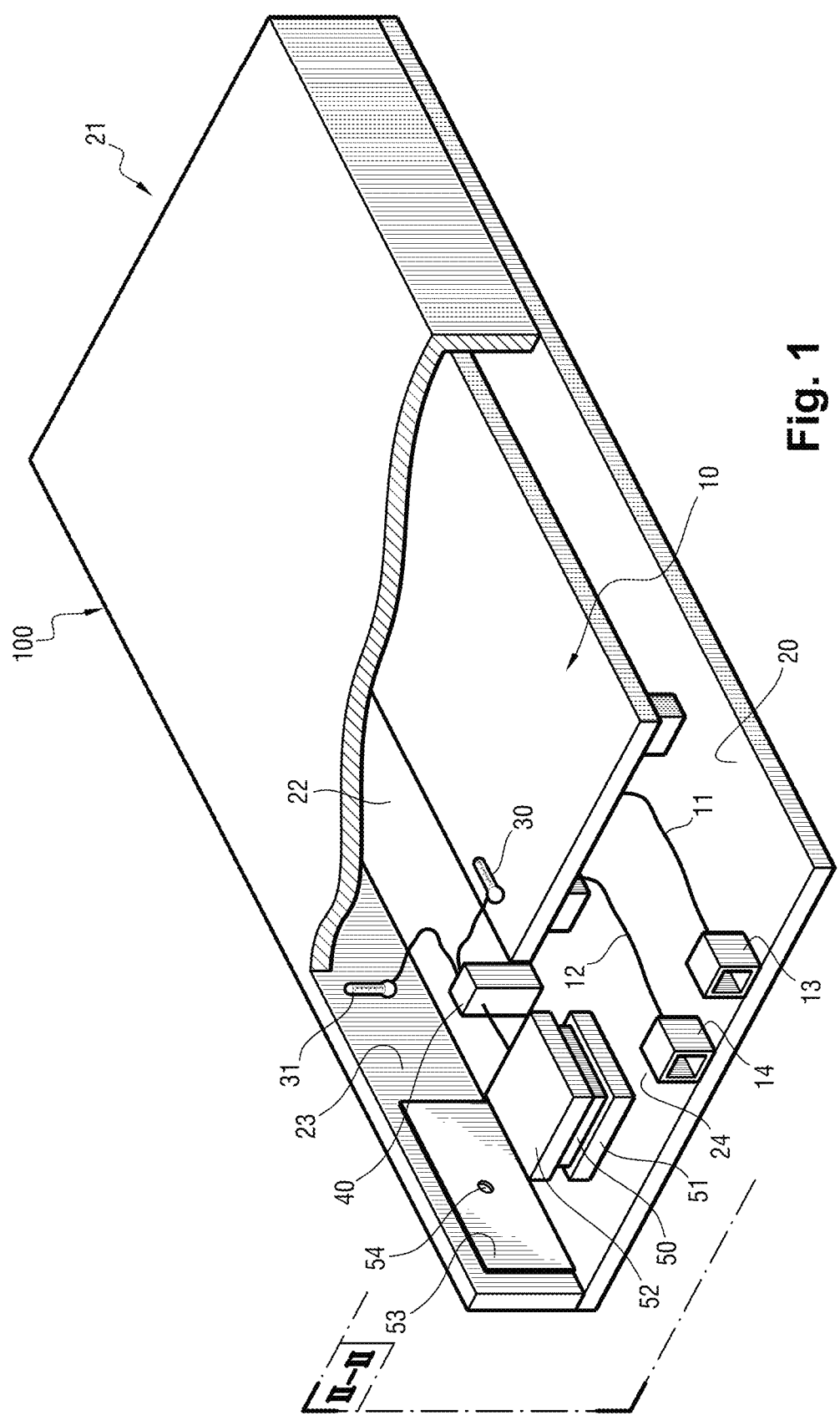
FIG. 1 is a partly cutaway diagrammatic perspective view of an electronic module according to a first embodiment of the invention.
Figure 2:
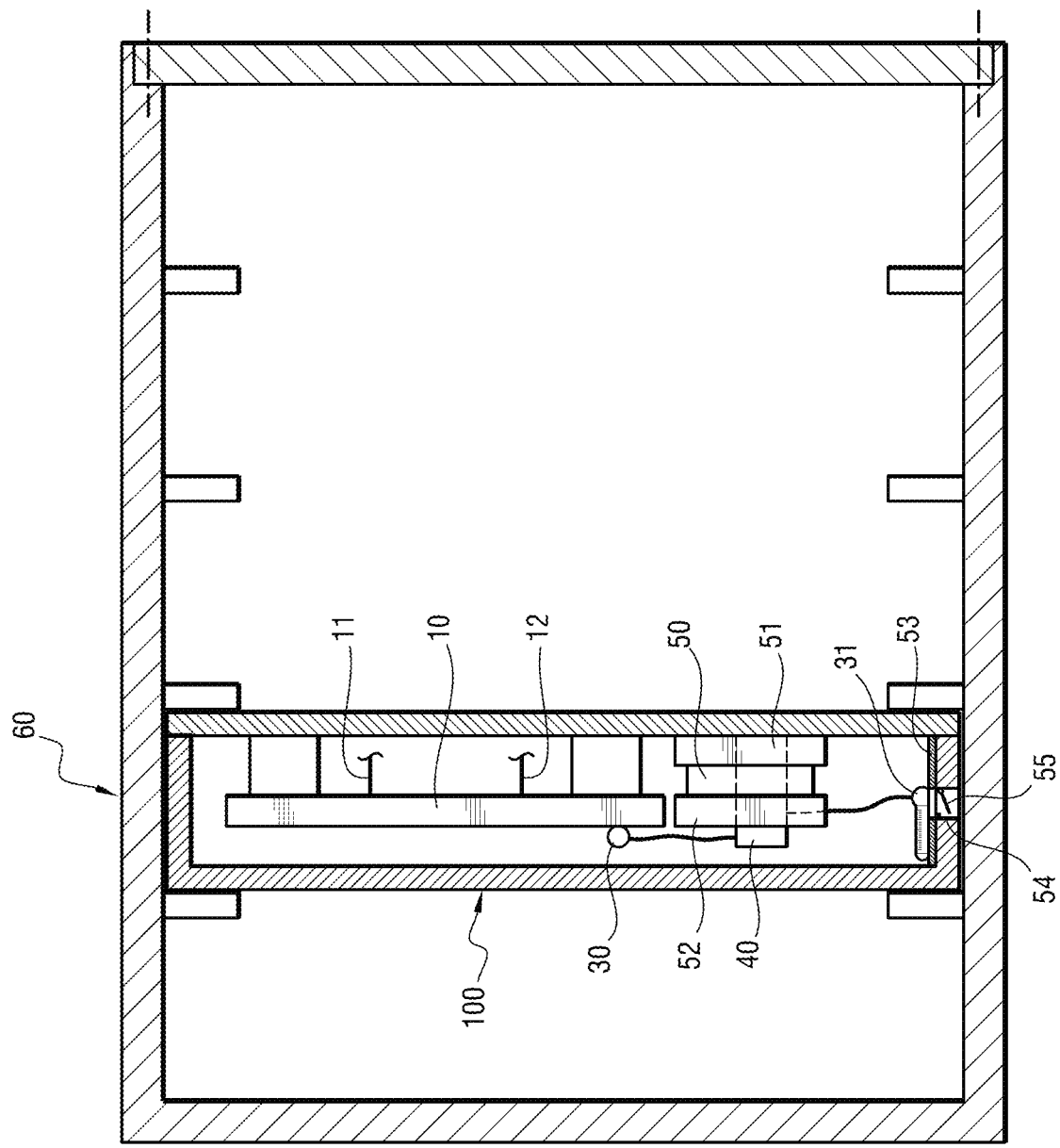
FIG. 2 is a diagrammatic view of the module from FIG. 1 in section taken along the line II-II.

Referring to FIGS. 1 and 2, the electronic module in accordance with the invention, generally designated 100, is here adapted to be mounted in an avionics rack 60 of an aircraft (not shown).

The electronic module 100 comprises an electronic circuit board 10 fixed onto a base 20 of a protective casing 21. Electronic tracks 11 and 12 respectively connect the electronic circuit card 10 to a first or data connector 13 and to a second or power supply connector 14 both of which open onto an external surface of the protective casing 21.

The protective casing 21 extends around the electronic circuit board 10 and defines an internal volume 22 of the electronic module 100. A first temperature sensor 30 and a second temperature sensor 31—both of resistive type—are respectively glued to the circuit board 10 and to an interior face 23 of the protective casing 21. A Peltier effect cell 50 having a hot surface 51 and a cold surface 52 has its hot surface 51 glued to an interior surface 24 of the base 20. A retention zone 53 vertically in line with the Peltier effect cell 50 when the electronic module 10 is plugged into the avionics rack 60 (FIG. 2) is covered with parylene. The retention zone 53 forms a cup at the center of which an orifice 54 provided with a valve 55 passes through the protective casing 21 and opens to the exterior of the latter.

A processor 40 is connected to the first and second temperature sensors 30 and 31 and to the Peltier effect cell 50. The processor 40 is supplied with energy via the power supply connector 14 and exchanges data with the outside via the data connector 13.

In operation, the processor 40 monitors and compares the temperatures $T_{30}$ and $T_{31}$ respectively measured by the first and second temperature sensors 30 and 31 in order to detect conditions liable to cause condensation of the moisture in the air contained in the internal volume 22 on the electronic circuit board 10. A situation of this kind may arise when the aircraft is started up after it has been subjected to a low temperature. The operation of one of the modules adjacent to the module 100 can heat the protective casing 21 and the air contained in the internal volume 24 before the electronic circuit board 10 has been activated and has been able to increase in temperature. The electronic circuit board 10 is then cooler than the air contained in the internal volume 24 and condensation is liable to be formed on the electronic circuit board 10. The temperature $T_{30}$ measured by the first temperature sensor 30 is then lower than the temperature $T_{31}$ measured by the second temperature sensor 31 and the processor 40 detects conditions liable to cause condensation of the moisture in the air contained in the internal volume 22 on the electronic circuit board 10. The processor 40 then triggers the operation of the Peltier effect cell 50. The cold surface 52 of the Peltier effect cell 50 then creates a cold zone the temperature $T_{52}$ of which is lower than that of the electronic circuit card 10. This lower temperature of the cold face 52 causes condensation on the latter rather than on the electronic circuit board 10, protecting the electronic circuit board 10 from condensation. The condensates formed on the surface of the cold face 52 drop by gravity into the retention zone 53 and are evacuated to the orifice 54.

There is therefore obtained an electronic module 100 the electronic circuit board 10 of which is protected by the protective casing 21 from dust, from exterior moisture, from smoke and mechanical attacks. The protective casing 21 may be demountable in order for the electronic circuit board 10 to be easily accessible and, requiring no varnish protection, therefore easily repairable. The Peltier effect cell 50 enables the electronic circuit board 10 to be protected from moisture contained in the internal volume 22.

According to a second embodiment, the processor 40 triggers the operation of the Peltier effect cell 50 only after previously effecting a comparison between the temperature $T_{30}$ measured by the first temperature sensor 30 and a threshold temperature $T_{s10}$, here equal to twenty degrees Celsius. If the temperature $T_{30}$ measured by the first temperature sensor 30 is higher than the threshold temperature $T_{s10}$ the processor 40 does not trigger the operation of the Peltier effect cell 50. If the temperature $T_{30}$ measured by the first temperature sensor 30 is lower than the threshold temperature $T_{s10}$ the processor 40 triggers the operation of the Peltier effect cell 50 if the temperature $T_{30}$ measured by the first temperature sensor 30 is lower than the temperature $T_{31}$ measured by the second temperature sensor 31.

Figure 3:
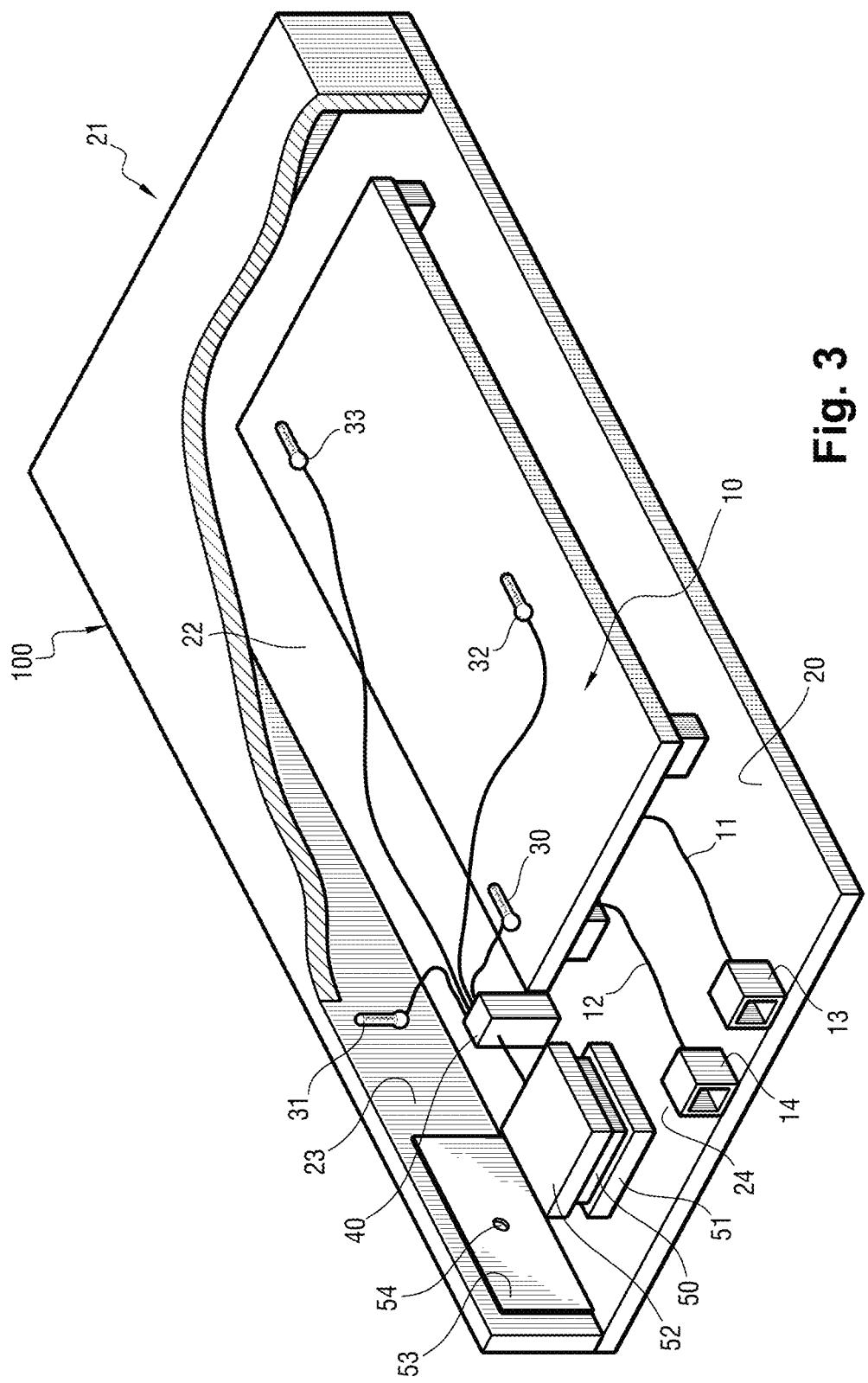
FIG. 3 is a partly cutaway diagrammatic perspective view of an electronic module in accordance with a third embodiment of the invention.

In accordance with a third embodiment shown in FIG. 3, the electronic circuit board 10 includes a third temperature sensor 32 and a fourth temperature sensor 33. The third temperature sensor 32 and the fourth temperature sensor 33 are placed on the electronic circuit board 10 in areas determined as a function of the topology of the electronic circuit board 10 and its heat dissipation profile to measure the temperatures of the areas of the electronic circuit board 10 that may be at lower temperatures than the rest of the electronic circuit board. These areas may be situated in the vicinity of components having a high thermal inertia such as for example the metal masses of voltage transformers. The condition liable to cause condensation of the moisture in the air contained in the internal volume 22 on the electronic circuit board 10 is then detected in the following manner. The processor 40 compares the temperatures $T_{30}$, $T_{32}$ and $T_{33}$ respectively measured by the first temperature sensor 30, the third temperature sensor 32 and the fourth temperature sensor 33 and retains the lowest temperature $T_{min(30, 32, 33)}$. This lowest temperature $T_{min(30, 32, 33)}$ can then be compared to the threshold temperature $T_{s10}$. If the lowest temperature $T_{min(30, 32, 33)}$ is lower than the threshold temperature $T_{s10}$, the processor 40 then compares the lowest temperature $T_{min(30, 32, 33)}$ with the temperature $T_{31}$ measured by the second temperature sensor 31.

If the lowest temperature $T_{min(30, 32, 33)}$ is lower than the temperature $T_{31}$ measured by the second temperature sensor 31 the processor 40 detects conditions liable to cause condensation of the moisture in the air contained in the internal volume 22 on the electronic circuit board 10. The processor 40 then triggers the operation of the Peltier effect cell 50.

Of course, the invention is not limited to the embodiments described but rather encompasses any variant falling within the scope of the invention as defined by the claims.

In particular:
  although here the cold zone is generated by a Peltier effect cell, the invention applies equally to other means of generating a cold zone separated from the electronic circuit board such as for example an electrical tracer that heats the circuit board, which therefore implies that a cold zone is generated elsewhere than on the circuit board (for example on a shroud of the data or power supply connector);

although the cold zone is generated by a Peltier effect cell, the invention applies equally to other means of generating a cold zone separate from the electronic circuit board such as for example a cryostat;

although here the conditions liable to cause condensation of the moisture in the air contained in the internal volume are detected by two temperature sensors, the invention applies equally to other means of detecting a predetermined environmental condition such as for example a hygrometer, a single temperature sensor possibly coupled to a pressure sensor, a dew point detector, a condensation sensor;

although here the temperature sensors are resistive sensors, the invention applies equally to other means of measuring temperatures such as for example infrared or capacitive sensors;

although here the temperature sensors are stuck to the electronic circuit board or the protective casing, the invention applies equally to other means of fastening the sensors such as for example screwing or clipping means;

although here the retention zone is in the form of a cup coated with a layer of parylene resin, the invention applies equally to a retention zone of different or plane shape, protected or not by a coating that may be different from parylene, such as for example paint, a synthetic material or metal insert;

although here the retention zone is provided with an orifice opening to the exterior of the internal volume and provided with a valve, the invention applies equally to other configurations of the retention zone such as for example a retention zone the orifice of which has no valve or a retention zone that has no orifice;

although here the hot face of the Peltier effect cell is connected to the protective casing, the invention applies equally to a connection of the hot face of the Peltier effect cell to other types of elements of the electronic module such as for example to a thermally conductive chassis of the electronic module;

although here the electronic circuit board is fixed to a base of the protective casing, the invention applies equally to other configurations of the protective casing such as for example a protective casing the base of which consists of the electronic circuit card itself;

although here the temperature sensors and the Peltier effects that are connected to a processor, the invention applies equally to other types of control unit such as for example a microcontroller or an FPGA;

although here the threshold temperature is equal to twenty degrees Celsius, the invention applies equally to other predetermined threshold values that may in particular be chosen according to the specific operating conditions of the electronic module, such as for example a threshold temperature higher than or lower than twenty degrees Celsius;

although here the electronic circuit board includes third and fourth temperature sensors, the invention applies equally to an electronic circuit board comprising a different number of temperature sensors such as for example two or more than three sensors.

The invention claimed is:

1. An electronic module configured for being mounted on an avionics rack, the electronic module including:
   a protective casing defining an internal volume, the protective casing being adapted to be received by the avionics rack;
   an electronic circuit board placed in the internal volume;
   means for detecting a predetermined environmental condition of the internal volume;
   means for generating a cold zone inside the internal volume such that the cold zone is separated from the electronic circuit board;
   a control unit that is connected to the means for detecting a predetermined environmental condition and to the means for generating a cold zone,
   the control unit being adapted to trigger the means for generating a cold zone when the means for detecting a predetermined environmental condition in the internal volume detect an environmental condition that is liable to result in the moisture in the air contained in the internal volume condensing on the electronic circuit board,
   wherein the means for detecting a predetermined environmental condition comprise a first temperature sensor fastened to the electronic circuit board and a second temperature sensor fastened to the protective casing, and wherein the control unit is adapted to trigger the means for generating a cold zone exclusively based on the analysis of a difference between a first temperature measured by the first temperature sensor and a second temperature measured by the second temperature sensor, the control unit being arranged to trigger the means for generating a cold zone when the first temperature is lower than the second temperature such that a moisture present in the internal volume is forced to condense in the cold zone.

2. The electronic module as claimed in claim 1, in which the control unit is adapted to trigger the means for generating a cold zone only if the temperature measured by the first temperature sensor is lower than a predetermined threshold temperature.

3. The electronic module as claimed in claim 1, in which the means for detecting a predetermined environmental condition comprise a third temperature sensor fastened to the electronic circuit board.

4. The electronic module as claimed in claim 1, in which the means for generating a cold zone comprise a Peltier effect cell that has a hot face and a cold face.

5. The electronic module as claimed in claim 4, in which the hot face of the Peltier effect cell is thermally connected to the protective casing or to a thermally conductive chassis of the electronic module.

6. The electronic module as claimed claim 1, in which the means for generating a cold zone are such that the condensates resulting from the condensation of the air contained in the internal volume are directed to a dedicated retention zone of the internal volume and/or to the exterior of the internal volume.

7. The electronic module as claimed in claim 6, in which the retention zone is coated with a protective resin.

\* \* \* \* \*